(12) United States Patent
Chen et al.

(10) Patent No.: US 9,735,289 B2
(45) Date of Patent: Aug. 15, 2017

(54) ION IMPLANTATION-ASSISTED ETCH-BACK PROCESS FOR IMPROVING SPACER SHAPE AND SPACER WIDTH CONTROL

(71) Applicant: Cypress Semiconductor Corporation, San Jose, CA (US)

(72) Inventors: Gong Chen, San Jose, CA (US); Scott Bell, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 338 days.

(21) Appl. No.: 14/051,859

(22) Filed: Oct. 11, 2013

(65) Prior Publication Data

US 2015/0102400 A1 Apr. 16, 2015

(51) Int. Cl.
| | |
|---|---|
| *H01L 29/788* | (2006.01) |
| *H01L 21/28* | (2006.01) |
| *H01L 21/336* | (2006.01) |
| *H01L 29/792* | (2006.01) |
| *H01L 21/033* | (2006.01) |
| *H01L 21/311* | (2006.01) |
| *H01L 21/3213* | (2006.01) |
| *H01L 29/423* | (2006.01) |
| *H01L 29/66* | (2006.01) |
| *H01L 21/3215* | (2006.01) |

(52) U.S. Cl.
CPC ........ *H01L 29/792* (2013.01); *H01L 21/0337* (2013.01); *H01L 21/28282* (2013.01); *H01L 21/31144* (2013.01); *H01L 21/32137* (2013.01); *H01L 29/42344* (2013.01); *H01L 29/66833* (2013.01); *H01L 21/32155* (2013.01)

(58) Field of Classification Search
CPC ............... H01L 29/792; H01L 21/0337; H01L 21/28282; H01L 21/31144; H01L 21/32137; H01L 29/42344; H01L 29/66833; H01L 21/32155
USPC .................................................. 257/320–330
See application file for complete search history.

(56) References Cited

U.S. PATENT DOCUMENTS

| | | | | |
|---|---|---|---|---|
| 2005/0230736 | A1* | 10/2005 | Ishimaru ............ | G11C 16/0466 257/314 |
| 2012/0132978 | A1* | 5/2012 | Toba ................. | H01L 21/28282 257/316 |

* cited by examiner

*Primary Examiner* — Marc Armand
*Assistant Examiner* — Nelson Garces

(57) ABSTRACT

Disclosed herein is a semiconductor device including a first dielectric disposed over a channel region of a transistor formed in a substrate and a gate disposed over the first dielectric. The semiconductor device further includes a second dielectric disposed vertically, substantially perpendicular to the substrate, at an edge of the gate, and a spacer disposed proximate to the second dielectric. The spacer includes a cross-section with a perimeter that includes a top curved portion and a vertical portion that is substantially perpendicular to the substrate. Further, disclosed herein, are methods associated with the fabrication of the aforementioned semiconductor device.

17 Claims, 5 Drawing Sheets

ION IMPLANTATION-ASSISTED ETCH-BACK PROCESS FOR IMPROVING SPACER SHAPE AND SPACER WIDTH CONTROL

BACKGROUND OF THE INVENTION

Technical Field

The present disclosure relates to the fabrication of spacers. More specifically, the present disclosure relates to fabricating spacers having vertical sidewalls and to improving spacer shape and spacer width.

Related Art

In integrated circuit fabrication technology, a spacer is a structural feature commonly formed proximate to a sidewall of a topographical feature. One function of the spacer may be to improve the electrical performance of a device comprising the topographical feature. Another function of the spacer is to act as a mask during fabrication.

For example, in modern complementary metal oxide semiconductor (CMOS) processes, oxide or nitride spacers may be formed at the sidewalls of a polycrystalline silicon (poly-Si) transistor gate in order to electrically isolate the gate from the transistor's source and drain terminals. Similarly, in modern bipolar junction transistor (BJT) technologies, in which the BJTs have self-aligned emitters, oxide spacers may be formed at an edge of a self-aligned emitter in order to isolate the emitter from the base electrode.

Further, spacers are used as ion implantation hard masks for achieving double-diffused structures in lightly doped drain/source metal oxide field-effect transistors (LDD-MOSFETs). Spacers may also be used as hard masks for transferring patterns in an underlying layer or substrate. In the latter application, the use of spacers enhances a conventional lithography process by allowing double the expected number of features to be transferred to the underlying layer or substrate in one exposure step. Furthermore, in self-aligned silicide layer formation, spacers may be used to prevent shorting the gate and source/drain terminals during the salicide process.

A spacer may also serve as an active terminal of a device. For example, in split-gate transistors, which are used in embedded charge trapping memory devices, a poly-Si spacer may be used to form one of the two gates of a split-gate transistor memory cell. The poly-Si spacer gate is typically metallized and serves as a select gate for the memory cell.

There are several parameters to consider when fabricating spacers, especially when they are to be used in the applications mentioned above. Etch rate, etch chemistry, material deposition thickness, among other parameters, may all affect the spacers' shape and width. Offsets in width or irregular sidewall profiles result from non-ideal fabrication conditions, which directly affect overall device performance.

For example, a split-gate transistor may have an undesired drive strength or selection threshold if there is an offset in the selection gate spacer's nominal width. Furthermore, a tapered or curved spacer sidewall profile may result in shorting the gate and drain terminals during a salicide process. Also, in applications where spacers are used for pattern transfer, incorrect feature sizes and incorrect pitch values may result from offsets in nominal spacer width and from tapered or curved spacer sidewall profiles.

BRIEF SUMMARY OF THE INVENTION

Disclosed herein are structure and method embodiments comprising spacers having highly vertical sidewalls and spacers which can be fabricated with improved process control.

One embodiment is directed to a semiconductor device comprising a first dielectric disposed over a channel region of a transistor formed in a substrate and a gate disposed over the first dielectric. The semiconductor device further includes a second dielectric disposed vertically, substantially perpendicular to the substrate, at an edge of the gate, and a spacer disposed proximate to the second dielectric. The spacer includes a cross-section with a perimeter that includes a top curved portion and a vertical portion that is substantially perpendicular to the substrate.

Another embodiment is directed to a method of fabricating a semiconductor device. The method comprises disposing a layer of material on a substrate that is conformal to features already patterned on the substrate. The method further comprises doping the layer of material using a substantially 0-degree tilt ion implantation procedure, followed by etching the layer of material to form one or more spacers proximate to sidewalls of the features patterned on the substrate.

Yet another embodiment is directed to a method of fabricating a semiconductor device that includes disposing a gate structure on a semiconductor substrate. The gate structure includes at least the following structural features: a gate, a first dielectric disposed beneath the gate, and a second dielectric disposed at least on sidewalls of the gate and over the gate. The method further comprises disposing a layer of material over the second dielectric and doping the layer of material using a substantially 0-degree tilt ion implantation procedure. Furthermore, the method comprises etching the layer of material to form one or more spacers proximate to the sidewalls of the gate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
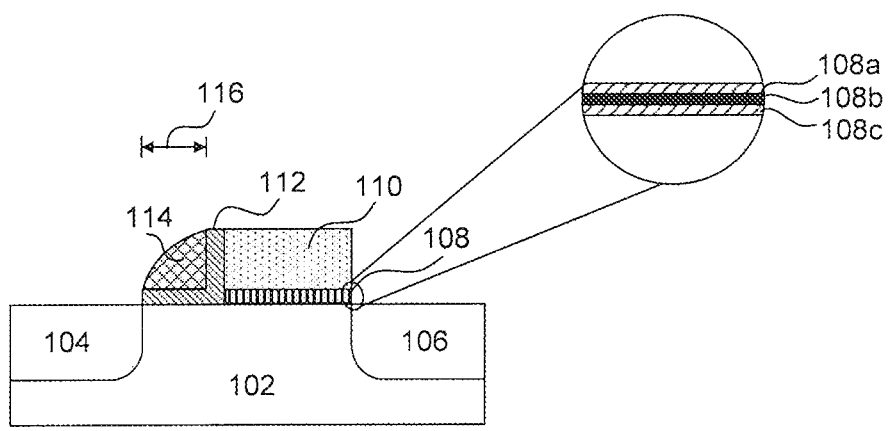
FIG. 1 is a cross-sectional view of a split-gate transistor comprising a spacer having a curved sidewall.

The features and advantages of embodiments of the present invention will become more apparent from the detailed description set forth below when taken in conjunction with the drawings. In the drawings, like reference numbers generally indicate identical or similar elements, unless otherwise mentioned. Additionally, generally, the left-most digit(s) of a reference number identifies the drawing in which the reference number first appears.

DETAILED DESCRIPTION OF THE INVENTION

This specification discloses one or more embodiments that incorporate features of this invention. The disclosed embodiment(s) merely exemplify the present invention. The scope of the present invention is not limited to the disclosed embodiment(s).

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not expressly described.

Before describing the various embodiments in detail, further explanation shall be given regarding certain terms that are used throughout the descriptions.

The terms "etch" or "etching" or "etch-back process" are used herein to generally describe a fabrication process of patterning a material such that at least a portion of the material remains after etching is completed. It shall be construed that etching a semiconductor material, for example, involves the steps of patterning a mask layer disposed over the semiconductor material (e.g., a photoresist layer or a hard mask), subsequently removing areas of the semiconductor material that are no longer protected by the mask layer, and optionally removing remaining portions of the mask layer. It shall also be construed that such removing step is conducted using an "etchant" and that such an etchant has a "selectivity" that is higher to the semiconductor material than to the mask layer. Further, it shall be understood that etching may be used in general terms without a mask layer, yet still yielding removed parts and remaining parts of the etched material.

The term "selectivity" between two materials is described herein as the ratio between the etch rates of the two materials under the same etching conditions. For example, an etchant with a selectivity of 3:1 to the semiconductor over the mask layer means that the etchant removes the semiconductor material at a rate three times faster than that at which it removes the mask layer.

The term "substrate" is used herein to generally describe a material onto which subsequent material layers are added. In this disclosure, the substrate itself may be patterned and materials added on top of it may also be patterned or remain without patterning. Furthermore, although throughout the following descriptions, the substrate is most commonly thought to be silicon, the substrate may also be any of a wide variety of materials, including commonly used semiconductor materials.

Further, it shall be understood that devices fabricated in and/or on the substrate may be in several regions of the substrate and furthermore that these regions may not be mutually exclusive. That is, in some embodiments, portions of one or more regions may overlap.

Further, the terms "deposit" or "dispose" are used herein to describe the act of applying a layer of material to the substrate or to layers already applied to the substrate, whether these layers are patterned or not. Further, it shall be understood that the deposited layer of material is conformal, unless otherwise mentioned. The term "conformal" is used herein to describe a film that at least partially covers one or more sidewalls of features patterned on a substrate.

The term "substantially perpendicular," in reference to a topographical feature's sidewall, is used herein to generally describe a sidewall disposed at an angle ranging between about 85 degrees and 90 degrees with respect to the substrate. The term "substantially 0-degree tilt," in reference to ion implantation procedures, is used herein to generally describe ion implantation procedures wherein the energetic ions are accelerated towards a substrate following a path that forms an angle ranging between about 85 degrees and 90 degrees with respect to the substrate. Lastly, the term "substantially longer" is used herein, in reference to the length of a first feature relative to that of a second feature, to generally imply that the length of the first feature is a least twice the length of the second feature.

Turning now to the drawings, FIG. 1 illustrates an example of a non-volatile memory cell 100 having a split-gate transistor architecture. Memory cell 100 is formed on substrate 102. For ease of description, substrate 102 is assumed to be silicon. Other substrate materials may be used. Further, substrate 102 may be p-type silicon or a p-type well formed in an n-type silicon substrate or well. Memory cell 100 includes a first n-type doped region 104 and a second n-type doped region 106. The first doped region 104 may be used as a source/drain region, and similarly, the second doped region 106 may also be used as a source/drain region. While regions 104 and 106 are n-type in this example, they may also be p-type regions when substrate 102 is n-type silicon or an n-type well formed in a p-type silicon substrate. Further, regions 104 and 106 may be formed, for example, using ion implantation. For convenience, region 104 is referred herein as the drain of memory cell 100, and region 106 is referred to as a the source of memory cell 100, irrespective of biases applied thereto. The terms drain and source are used by convention, not as limitations.

Memory cell 100 includes two gates, a select gate 114 and a memory gate 110. Each gate may be a poly-Si layer. As shall be described below, select gate 114 is a spacer. Select gate 114 is disposed over dielectric layer 112, whereas memory gate 110 is disposed over a charge-trapping dielectric 108. The charge-trapping dielectric 108 may include, for example, a charge-trapping silicon nitride layer 108b sandwiched between two silicon dioxide layers 108a and 108c; this three-layer arrangement is referred to as an "oxide, nitride, oxide (ONO) stack," or simply as "ONO layers." Alternatively, charge-trapping dielectric 108 may include a silicon-rich nitride film, or any film that includes, but is not limited to, silicon, oxygen, and nitrogen, in various stoichiometries.

Dielectric 112 electrically isolates select gate 114 from memory gate 110. Dielectric 112 comprises a first portion that is disposed vertically, i.e., substantially perpendicular to substrate 102, and a second portion disposed horizontally beneath select gate 114. The first portion and the second portion are connected to one another, e.g., dielectric 112 may be deposited in a single step to form its horizontal and vertical portions. In some examples, dielectric 112 and charge trapping dielectric 108 may have the same architecture, e.g., they may both be ONO stacks, while in other examples they may be physically distinguishable. For example, dielectric 112 is assumed to be a single-layer silicon dioxide film whereas dielectric 108 is an ONO stack.

To better understand how offsets in select gate 114 affect performance of memory cell 100, example write, erase, and read operations, as they relate to memory cell 100, shall now be described. In order to "write" a digital bit in memory cell 100, a positive voltage on the order of 5 volts, for example, is applied to region 106 while region 104 and substrate 102 are grounded. A low positive voltage on the order of 1.5 volts, for example, is applied to select gate 114 while a higher positive voltage on the order of 8 volts, for example, is applied to memory gate 110. As electrons are accelerated within a channel region between source and drain, some acquire sufficient energy to transport upwards and become trapped within charge-trapping dielectric 108. This phenomenon is known as hot electron injection, and it is an example mechanism for storing charge within charge-trapping dielectric 108. As such, charges trapped within charge-trapping dielectric 108 correspond to the "high" bit state of memory cell 100. The trapped charge is retained even after the various voltage supplies are removed, hence the term "non-volatile" attributed to memory cell 100 in the preceding paragraphs.

To "erase" memory cell 100 (i.e., in order to remove charges trapped in charge-trapping dielectric 108 due to hot electron injection) a positive voltage on the order of 5 volts, for example, is applied to region 106 while region 104 is held at a fixed bias or simply left floating, and select gate 108 and substrate 102 are grounded. A high-magnitude negative voltage, −8 volts for example, is applied to memory gate 110. Under these bias conditions, channel holes gain sufficient kinetic energy to overcome the oxide barrier and are injected into the charge-trapping layer. This added positive charge compensates the trapped negative charged electrons, thereby effectively erasing memory cell 100 to put it in the "low" bit state.

To "read" the state of memory cell 100, a low voltage applied is to memory gate 110 and to select gate 114. The low voltage is chosen so that it lies substantially equidistant between the threshold voltage necessary to turn on the split-gate transistor when storing a "high" bit and the threshold voltage necessary to turn on the split-gate transistor when storing a "low" bit. As such, if the application of the low voltage during the "read" operation caused substantial current flow between regions 104 and 106, then the memory cell holds a "low" bit. Conversely, if the application of the low voltage during the "read" operation caused no current follow between regions 104 and 106, then the memory cell holds a "high" bit.

Since the current during the "read" operation is directly proportional to the width of the memory gate 110 and to the width 116 of select gate 114, the width of each gate is a critical dimension, in other words, the width of memory gate 110 and the width of select gate 114 must be fabricated within tight process tolerances in order to yield a gate width substantially equal to a nominal width set forth during the design of memory cell 100. Otherwise, if the gate widths are either too short or too long as compared to the nominal width, incorrect operation of memory cell 100 will occur. Further, in an array comprising a plurality of memory cells such as memory cell 100, each cell would have different characteristics due to mismatches in select gate length. This mismatch leads to poor memory array performance. As shall be seen below, while it may be possible to accurately control the width of memory gate 110 during fabrication, controlling the width 116 of select gate 114 is more complicated.

FIGS. 2A-2E illustrate cross-sectional views of an example fabrication process for the memory cell 100 shown FIG. 1. It is to be understood that this description is meant to provide a general overview of the major steps involved in fabricating a split-gate transistor and that, in actual practice, many more features and/or fabrication steps may be provided to form memory cell 100.

Figure 2A:
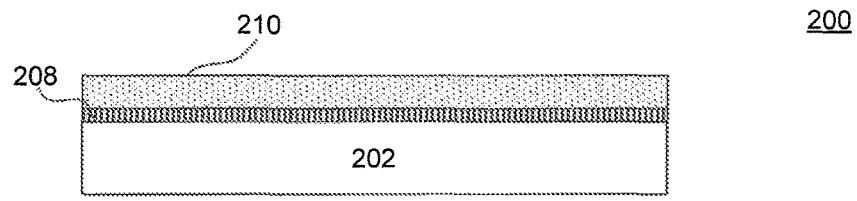
FIGS. 2A-2E illustrate various cross-sectional views of split-gate transistors during an example fabrication process.

FIG. 2A shows a semiconductor substrate 202 (for example silicon) having disposed thereon a dielectric 208 and a transistor gate layer 210. Substrate 202 may be p-type or n-type silicon as described previously. Further, substrate 202 may be a specific region of a larger semiconductor substrate (not shown). Dielectric 208 may comprise a stack of multiple dielectrics such as an ONO stack. Transistor gate layer 210 may be a poly-Si film, a metal alloy, or any other material that may serve as a transistor gate. For ease of description, it is assumed that dielectric 208 and transistor gate layer 210 are an ONO stack and a polycrystalline film, respectively.

Dielectric 208 and transistor gate layer 210 may be deposited on substrate 202 by conventional deposition methods. For example, the nitride layer of the ONO stack comprised in dielectric 208 may be deposited using low pressure chemical vapor deposition (LPCVD), whereas the oxide layer disposed under the nitride film of the ONO stack may be grown directly from substrate 202 using thermal oxidation; further, the oxide layer disposed over the silicon nitride film in the ONO stack may also be deposited using plasma-enhanced chemical vapor deposition (PECVD). Similarly, transistor gate layer 210 may be deposited via PECVD or any other methods typically used to deposit polycrystalline silicon. It shall be understood that different deposition (or growth) methods may impart varying electrical characteristic to memory cell 100 due to varying film qualities.

Figure 2B:
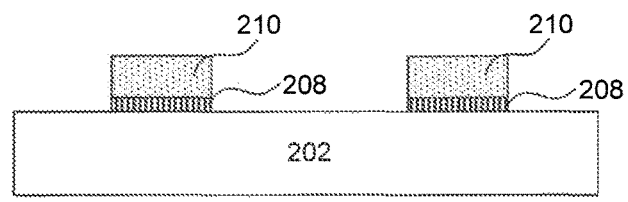

FIG. 2B shows semiconductor device 200 having two transistor gates, and a gate dielectric disposed thereunder. While only two transistor gates are shown in FIG. 2B, it shall be understood that more than two gates may be formed. The two transistor gates are formed by patterning transistor gate layer 210. The patterning of transistor gate layer 210 may be achieved by defining an etch mask (not shown) using photolithography and subsequently etching exposed regions of transistor gate layer 210 with an etchant that has higher selectivity to transistor gate layer 210 than to the etch mask. While this patterning step is defined in general terms, one of skill in the art would readily understand that transistor gate layer 210 may be patterned with more advanced lithography techniques, such as for example a double patterning step. Following the pattering of transistor gate layer 210, exposed regions of dielectric 208 are removed. Transistor gate layer 210 thereby serves as a hard mask for the removal of the exposed regions of dielectric 208.

Figure 2C:
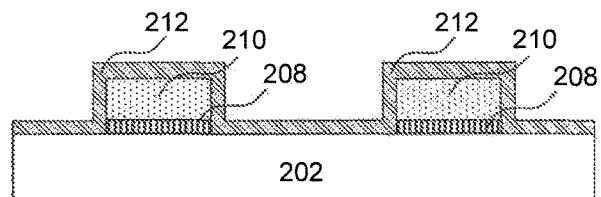

FIG. 2C shows the formation of a conformal dielectric 212 layer on and around both gates. Dielectric 212 may be deposited utilizing a deposition process which enables step coverage. Such deposition processes may be, for example, PECVD. While dielectric 212 may be any of a wide variety of commonly used dielectrics, it is assumed, for ease of description, to be silicon dioxide. Dielectric 212 may be of equal thickness or thicker than dielectric 208. Dielectric 212 further extends over the region between the formed transistor gates.

Figure 2D:
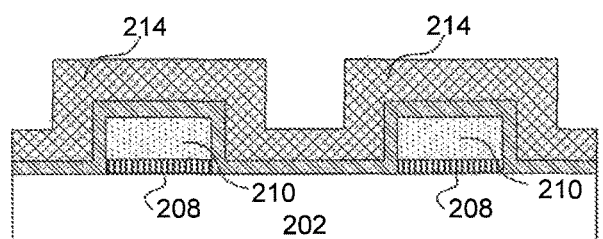

FIG. 2D shows the disposition of a spacer layer 214 on the semiconductor device 200 of FIG. 2C. Spacer layer 214 is disposed on dielectric 212 utilizing a conformal deposition process. Again, PECVD may be used to deposit spacer layer 214. For ease of description, spacer layer 214 may be for example a poly-Si film. The deposited thickness of spacer layer 214 may be, for example, less than the thickness of transistor gate layer 210.

Figure 2E:
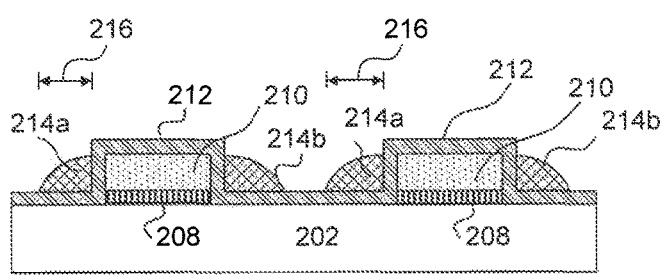

Following the deposition of spacer layer 214, an etch mask is disposed on spacer layer 214 and patterned (step not shown). The pattern defined in the etch mask are for forming two spacers on either side of each gate. As shown in FIG. 2E, following the etch-back process, spacers 214a and 214b are formed on either side of transistor gate layer 210a and 210b. As shown in FIG. 2E, the formed spacers 214a have a cross-sectional view that comprises a perimeter having a curved portion. In some instances, the spacer's sidewall may be sloped.

This sidewall shape results from increased corner erosion during the etch-back process and from the anisotropy of the dry etchants typically used to conduct poly-Si etching (e.g., reactive ion etching (RIE) in chloro-fluorine plasmas). Specifically, since spacer layer 214 has a step due to the elevation of transistor gate layer 210, spacer layer 214 must be over-etched in order to completely remove the portion of spacer layer 214 located directly on top of the gate. Further, since the region of spacer layer 214 that is on the sidewall of transistor gate layer 210 is conformal and inherently exhibits a curved portion, the spacer resulting from the etch-back process also has an outward curved sidewall since the etchant is anisotropic.

In addition to a curved sidewall profile, the aforementioned process conditions introduce offsets in the final width of spacer 214. For example, variation in the duration of the etch-back process is directly related to how much corner erosion occurs. As such, spacer 214 may have a width 216 that is shorter than the targeted nominal width.

Figure 3:
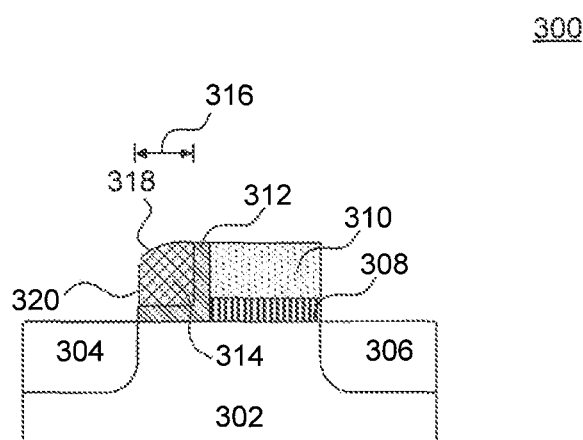
FIG. 3 shows a split-gate transistor, according to an example embodiment.

FIG. 3 illustrates an example non-volatile memory cell 300, according to an embodiment of the present invention. Memory cell 300 is formed on substrate 302. Substrate 302 is silicon and may be a p-type silicon bulk or a p-type region in an n-type bulk or well. Memory cell 300 includes a first n-type region 304 and a second n-type region 306. The first doped region 304 may be used as a source/drain region, and similarly the second doped region 306 may be used as a source/drain region. While region 304 and region 306 are n-type in this example embodiment, they may also be p-type regions in another embodiment, when substrate 302 is an n-type bulk or an n-type well.

Memory cell 300 further includes two gates, a select gate 314, which is a spacer, and a memory gate 310. Gate 310 may be a poly-Si layer disposed and patterned using conventional techniques. However, select gate 314 is a spacer formed according to an example fabrication process, according to an embodiment of the present invention described below with reference to FIGS. 4A-4D.

Memory cell 300 includes at least two dielectrics. The first dielectric 312 is a silicon dioxide layer. Dielectric 312 comprises a horizontal portion disposed beneath select gate 314 and a vertical portion sandwiched between memory gate 310 and select gate 314. While in this embodiment the horizontal portion and the vertical portion of dielectric 312 are assumed to be of the same material, in alternate embodiments, the two portions may be two distinct dielectric materials.

The second dielectric 308 is disposed directly beneath memory gate 310, and it is a charge trapping dielectric. Charge trapping dielectric 308 may include for example a silicon nitride layer sandwiched between two silicon dioxide layers, thus forming an ONO stack similar to the one previously described in memory cell 100. Alternatively, dielectric 308 may include a silicon-rich nitride film, or any film that includes, but is not limited to, silicon, oxygen, or nitrogen, in various stoichiometries.

Memory cell 300 has similar operation to memory cell 100. However, memory cell 300 differs structurally from memory cell 100 since in memory cell 300, select gate 314 includes cross-section having a perimeter comprising a substantially vertical sidewall 320 in the portion farthest away from the edge of memory gate 310. Moreover, spacer 314 includes a top curved portion 318 shorter in length than vertical sidewall 320 so as to provide a relatively flat surface (when compared with spacer 214) on top of spacer 314 for subsequent metallization steps. The structural features of spacer 314 result from improved process control of critical dimension 316, which is the width of spacer 314, and from minimized corner erosion during fabrication, according to an embodiment of the present invention as shall be described below.

Figure 4A:
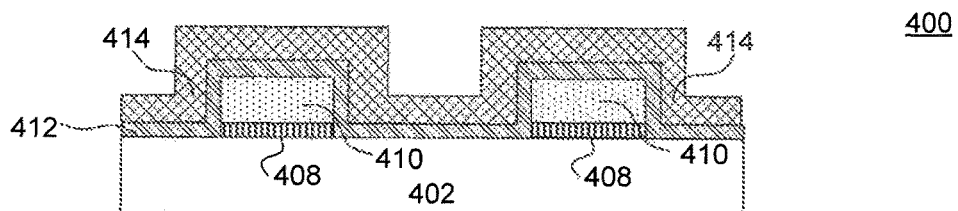
FIGS. 4A-4D illustrate various cross-sectional views of split-gate transistors during fabrication, according to an example embodiment.
Figure 4B:
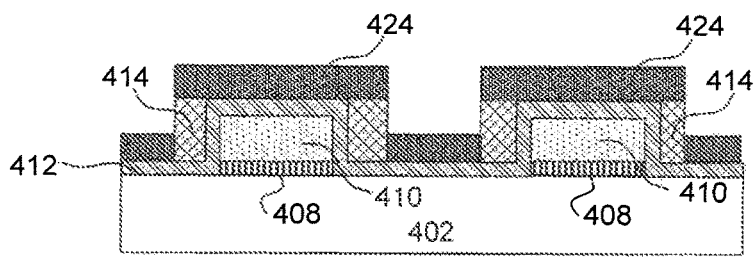
Figure 4C:
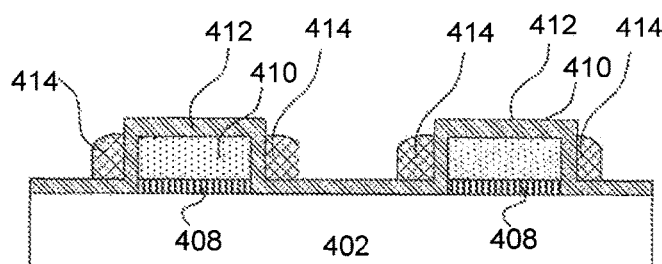

FIGS. 4A-4C illustrate various cross-sectional views of non-volatile memory cells 400, during their fabrication on substrate 402, according to an embodiment. While only two memory cells are shown, the many steps disclosed herein apply to more than two memory cells. Further, while a plurality of steps are described, steps generally undertaken in the fabrication of semiconductor devices are omitted for the sake of conciseness.

FIG. 4A illustrates a spacer layer 414 disposed in a conformal manner over two gate structures, each comprising a transistor gate 410. Spacer layer 414 and transistor gates 410 may be poly-Si deposited using conventional poly-Si deposition techniques, such as the ones mentioned earlier in this disclosure. There is disposed, under each gate 410, a charge trapping dielectric 408. Dielectric 408 may be an ONO stack, similar in structure to dielectric 308. Further, there is disposed a dielectric 412 that is conformal to gates 410. Dielectric 412 may be silicon dioxide for example, and as in the case of dielectric 312, it comprises a horizontal portion and a vertical portion. Next, spacer layer 414 is doped using a substantially 0-degree tilt ion implantation procedure. The tilt herein may be described as the angle the substrate makes with a path that is perpendicular to the direction followed by the energetic ions while they are bombarded onto spacer layer 414.

FIG. 4B illustrates implanted regions of spacer layer 414. Since a substantially 0-degree tilt is used during ion implantation, the ions are accelerated following a path perpendicular to the substrate, resulting in spacer layer 414 being selectively implanted. Portions of spacer layer 414 that are proximate to the vertical portion of dielectric 412 are masked from implantation, due to the highly vertical path of the implanted ions.

Several parameters may affect the thickness of regions 424, i.e., the penetration depth of the implanted ions. For example, the dosage or the energy of the accelerated ion prior to their entry into spacer layer 414 directly affect the thickness of regions 424. Generally, the higher the dosage or the energy, the deeper the ions will travel into spacer layer 414. As such, these parameters (dosage and energy) may be tuned in order to achieve a desired thickness for regions 424.

The ion implantation procedure may be carried out, for example, using n-type dopants such as arsenic (As) or phosphorous (P). N-type doped regions 424 exhibit a faster etch rate when compared to the etch rate of the undoped portions of spacer layer 414. This improved etch rate may be attributed at least to the damage induced by the energetic ions within regions 424 and to an increase in electron transfer rate from the bulk states to surface states resulting from the increased donor concentration. The latter mechanism further causes an increase electron transfer rate between surface states of regions 424 and the reactive halogen ions typically present in dry etchants of poly-Si (e.g., fluorine ions in fluorine-based plasma etchants). While n-type dopants are described in this embodiment, other ions may be implanted to produce the same desired effect. For example, in an alternative embodiment, ions such as argon ions, hydrogen ions, or nitrogen ions may be implanted to create regions 424. Due to the damage induced by these ions, the etch rate of the implanted regions would increase relative to the un-implanted regions of spacer layer 414.

Further, since the etch rate of regions 424 depends at least on electron transfer rates between surface states at the doped regions 424 and the reactive ions of the dry etchant, doping concentration achieved by the implantation procedure may also be varied in order to yield a desired etch rate for regions 424. Furthermore, annealing temperature following ion implantation may also be varied in order to modulate the etch rate of regions 424. Because annealing directly affects the concentration of activated dopants, an increase in activated dopant concentration causes the electron transfer rate between the doped regions and the reactive ions of the etchant to increase, thereby causing an increase in the etch rate of regions 424.

FIG. 4C shows memory cells 400 following the doping of spacer layer 414 and the etching of spacer layer 414 in a dry etchant, which produces spacers 414a and 414b. Spacers 414a and 414b each include a cross-section having an exposed perimeter comprising a substantially vertical sidewall 420 in the portion farthest away from gate 410. Moreover, spacers 414a and 414b each include a top curved portion 418 shorter in length than vertical sidewall 420. The relatively flat surface on top of spacers 414a and 414b is provided for subsequent metallization steps. The highly vertical sidewall 420 of spacers 414a and 414b results in the differential etch rate within spacer layer 414 resulting from the 0-degree tilt ion implantation procedure. As such, no over-etching is required and corner erosion is minimized, thus allowing greater process control over the width of spacers 414a and 414b.

Figure 4D:
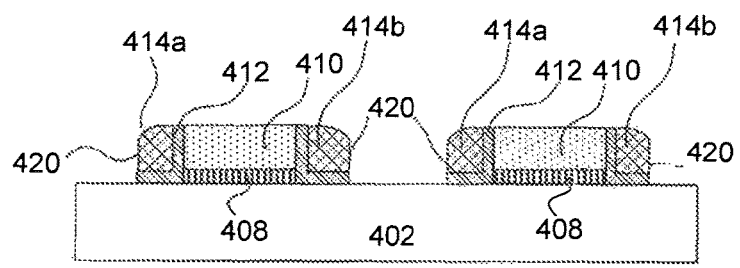

FIG. 4D illustrates memory cells 400 following additional steps undertaken to remove exposed regions of dielectric 412. Spacers 414b and the portion of dielectric 412 directly beneath them may be subsequently removed and source/drain regions may be implanted in order to yield the structure shown in the embodiment depicted in FIG. 3.

FIGS. 5A-5F illustrate a double patterning lithography process for fabricating a semiconductor device 500, according to an embodiment of the present invention.

Figure 5A:
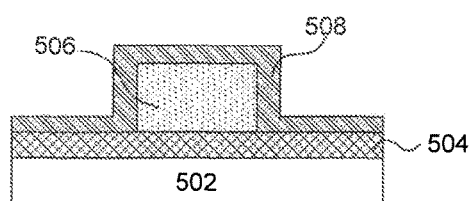
FIGS. 5A-5F illustrate various cross-sectional views of spacer structures used for transferring patterns to an underlying layer, according to an example embodiment.

FIG. 5A illustrates a spacer layer 508 disposed on a topographical feature 506. Topographical feature 506 is deposited and patterned, for example, using a conventional lithography process having a critical dimension. In this example embodiment, the critical dimension of the lithography process is described as the smallest feature size realizable by using the lithography process. Further, the width of topographical feature 506 is assumed to be equal to the critical dimension of the lithography process.

Spacer layer 508 is conformal to feature 506, and beneath feature 506 and part of spacer layer 508 there is disposed a structural layer 504. In this example embodiment, spacer layer 508 may be a poly-Si layer, topographical feature 506 may be a silicon nitride layer, structural layer 504 may be a silicon dioxide layer, and substrate 502 may be a silicon substrate. The aforementioned layers may be deposited and/or patterned using conventional methods.

Figure 5D:
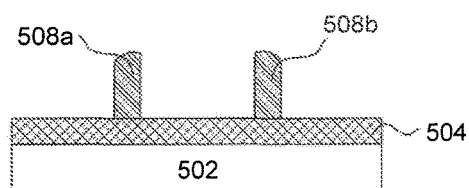
Figure 5B:
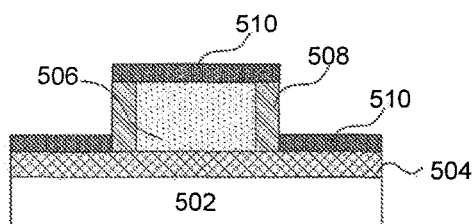

FIG. 5B shows semiconductor device 500 following a substantially 0-degree tilt ion implantation step. As in the case of FIG. 4B, regions 510 are doped regions that result from the ion implantation procedure. Since a 0-degree tilt is used during ion implantation, the ions are accelerated following a path substantially perpendicular to the substrate, resulting in spacer layer 508 being selectively implanted. Portions of spacer layer 508 that are proximate to the vertical portion of feature 506 are masked from implantation, due to the highly directional path of the implanted ions. As before, the dosage and the energy may be tuned to achieve a desired thickness for regions 510. Similarly, annealing temperature and dopant concentration may be varied in order to modulate the etch rate of regions 510.

Figure 5E:
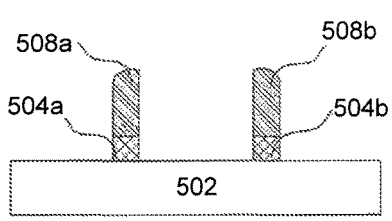
Figure 5C:
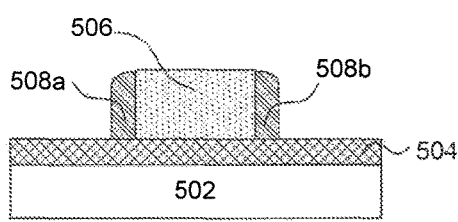

FIG. 5C shows semiconductor device 500 after an etchback process that removes regions 510. Since regions 510 have a higher etch rate than the undoped regions of spacer layer 508, the etch-back procedure yields spacers 508a and 508b proximate to the sidewalls of feature 506.

FIG. 5D shows semiconductor 500 after selective etchback process which removes feature 506. The etch-back process uses an etchant that has higher selectivity to feature 506 than to structural layer 504 and to spacers 508a and 508b. As such, only spacers 508a and 508b are left on structural layer 504. Spacers 509a and 508b serves as hard mask for a subsequent etch-back process, which removes exposed regions of structural layer 504. This etch-back process leaves structural feature 504a beneath spacer 508a and structural feature 504b beneath spacer 508b, as shown in FIG. 5E.

Figure 5F:
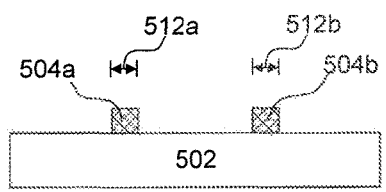

FIG. 5F shows semiconductor device 500 after the removal of spacers 508a and 508b. Feature sizes 512a and 512b correspond to the width of spacers 508a and 508b. Accordingly, precise control over feature sizes 512a and 512b is possible. Furthermore, since the thickness of spacer layer 508 can be well-controlled to dimensions below the critical dimension of the lithography process, it is thus possible to pattern features smaller in size than the critical dimension of the lithography process while maintaining tight process control over features 512a and 512b.

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention.

The breadth and scope of the invention should not be limited by any of the above-described exemplary embodiments, but should be defined only in accordance with the following claims and their equivalents.

What is claimed is:

1. A method of fabricating a semiconductor device, comprising:
    disposing a dielectric layer of material on a substrate, the dielectric layer of material conformal to features patterned on the substrate;
    disposing a layer of material over the dielectric layer of material;

implanting dopants into the layer of material using a substantially 0-degree tilt ion implantation step to create a doped portion of the layer of material which overlays at least an undoped portion of the layer of material; and etching the layer of material to form one or more spacers, wherein etching removes at least an entirety of the doped portion which overlays the undoped portion, wherein the one or more spacers are disposed proximate to sidewalls of the features patterned on the substrate.

2. The method of claim 1, wherein disposing the layer of material comprises disposing polycrystalline silicon.

3. The method of claim 1, wherein implanting the dopants comprises using n-type dopants.

4. The method of claim 1, wherein implanting the dopants comprises adjusting an energy or dosage of dopant ions to control a thickness of the doped portion.

5. The method of claim 4, wherein the thickness of the doped portion is substantially equal to a thickness of the layer of material.

6. A method of fabricating a semiconductor device, comprising:

disposing a gate structure on a substrate, the gate structure comprising: a gate, a first dielectric disposed beneath the gate, and a second dielectric at least on sidewalls of the gate and over the gate;

disposing a layer of material over the second dielectric;

implanting dopants into the layer of material using a substantially 0-degree tilt ion implantation step, to create a doped portion of the layer of material which overlays at least an undoped portion of the layer of material; and etching the layer of material to form one or more spacers, wherein etching removes at least an entirety of the doped portion which overlays the undoped portion, and wherein the one or more spacers are disposed proximate to the sidewalls of the gate.

7. The method of claim 6, wherein disposing the layer of material comprises disposing polycrystalline silicon.

8. The method of claim 6, wherein implanting the dopants comprises using n-type dopants.

9. The method of claim 6, wherein implanting the dopants comprises adjusting an energy or dosage of dopant ions to control a thickness of the doped portion.

10. The method of claim 6, wherein disposing the gate structure, comprises disposing the first dielectric by sequentially depositing oxide, nitride, and oxide (ONO) layers.

11. The method of claim 6, wherein disposing the gate structure, comprises disposing the second dielectric by sequentially depositing oxide, nitride, and oxide (ONO) layers.

12. The method of claim 1, wherein implanting the dopants comprises adjusting a doping concentration to control an etch rate of the doped portion.

13. The method of claim 1, further comprising annealing the semiconductor device, wherein annealing comprises adjusting an annealing temperature to control a concentration of activated dopants in the doped portion, wherein an increase in the concentration of activated dopants increases an etch rate of the doped portion.

14. The method of claim 1, wherein the doped portion has a greater etch rate than the undoped portion.

15. The method of claim 6, wherein implanting dopants comprises adjusting a doping concentration to control an etch rate of doped portion.

16. The method of claim 6, further comprising annealing the semiconductor device, wherein annealing comprises adjusting an annealing temperature to control a concentration of activated dopants in the doped portion, wherein an increase in the concentration of activated dopants increases an etch rate of the doped portion.

17. The method of claim 6, wherein the doped portion has a faster etch rate than the undoped portion.

\* \* \* \* \*